United States Patent
Kuo et al.

(10) Patent No.: US 10,510,573 B2
(45) Date of Patent: Dec. 17, 2019

(54) LOADING APPARATUS AND OPERATING METHOD THEREOF

(71) Applicant: Taiwan Semiconductor Manufacturing Co., Ltd., Hsinchu (TW)

(72) Inventors: Tsung-Sheng Kuo, New Taipei (TW); Hsuan Lee, Tainan (TW); Hsu-Shui Liu, Taoyuan (TW); Jiun-Rong Pai, Hsinchu County (TW); Chih-Hung Huang, Hsinchu County (TW); Yang-Ann Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 205 days.

(21) Appl. No.: 15/880,567

(22) Filed: Jan. 26, 2018

(65) Prior Publication Data
US 2019/0148200 A1    May 16, 2019

Related U.S. Application Data

(60) Provisional application No. 62/585,555, filed on Nov. 14, 2017.

(51) Int. Cl.
*H01L 21/677* (2006.01)
*H01L 21/67* (2006.01)

(52) U.S. Cl.
CPC .. *H01L 21/67778* (2013.01); *H01L 21/67265* (2013.01); *H01L 21/67769* (2013.01); *H01L 21/67772* (2013.01); *H01L 21/67775* (2013.01)

(58) Field of Classification Search
CPC ......... H01L 21/67775; H01L 21/67772; H01L 21/67724
See application file for complete search history.

(56) References Cited

U.S. PATENT DOCUMENTS 5,364,219 A * 11/1994 Takahashi ......... H01L 21/67724
                                                   118/719
6,238,283 B1 * 5/2001 Matsuyama ........ H01L 21/6732
                                                    454/187
(Continued)

FOREIGN PATENT DOCUMENTS

TW    I302010    10/2008
TW    I434797     4/2014
(Continued)

OTHER PUBLICATIONS

Office Action of Taiwan Counterpart Application, dated Nov. 14, 2018, pp. 1-5.

*Primary Examiner* — Mark C Hageman
(74) *Attorney, Agent, or Firm* — JCIPRNET

(57) ABSTRACT

A loading apparatus for processing a wafer cassette containing a plurality of wafers and an operating method thereof are provided. The operating method includes the following steps. The wafer cassette is loaded on a stage of the loading apparatus. The stage is configured to carry the wafer cassette and movably coupled to a main body of the loading apparatus to move within and out of a space of the main body. The stage is vertically moved among a standby position, a lifting position and an intermediate position; horizontally moved from the intermediate position to a door engaging position inside the space; positioned at the door engaging position, and a cassette door of the wafer cassette is opened. The stage is horizontally moved from the door engaging position to the intermediate position, and horizontally moved between the lifting position and an unloading position outside the space after opening the cassette door.

20 Claims, 14 Drawing Sheets

(56) References Cited

U.S. PATENT DOCUMENTS

| | | | | |
|---|---|---|---|---|
| 7,445,415 B2* | 11/2008 | Bonora | ............ | H01L 21/67775 |
| | | | | 414/217.1 |
| 7,942,619 B2* | 5/2011 | Hashimoto | ....... | H01L 21/67766 |
| | | | | 414/217 |
| 8,287,222 B2* | 10/2012 | Sawado | ............ | H01L 21/67724 |
| | | | | 414/279 |
| 2003/0031537 A1 | 2/2003 | Tokunaga | | |
| 2008/0075564 A1 | 3/2008 | Tachibana | | |

FOREIGN PATENT DOCUMENTS

| TW | I496237 | 8/2015 |
|---|---|---|
| TW | I570266 | 2/2017 |

\* cited by examiner

LOADING APPARATUS AND OPERATING METHOD THEREOF

CROSS-REFERENCE TO RELATED APPLICATION

This application claims the priority benefit of U.S. provisional application Ser. No. 62/585,555, filed on Nov. 14, 2017. The entirety of the above-mentioned patent application is hereby incorporated by reference herein and made a part of this specification.

BACKGROUND

Semiconductor wafers (to be referred to simply as wafers hereafter) are typically subjected to processing steps that involve transferring by a loading station between fabrication facilities. For example, semiconductor wafers are stored in a wafer cassette having a cassette door to secure the wafers and avoid damage during transferring. At each processing location, it is necessary to open the cassette door such that the wafers can be unloaded into the processing system. Conventionally, the cassette door is manually open/close and unloaded the wafers by a human operator. In modern fabrication facilities, a great emphasis is placed on limiting the presence of human operators in the processing zone. Accordingly, a need exists for loading stations that can automatically open/close the cassette door and unload the wafers to minimize contamination and labor requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
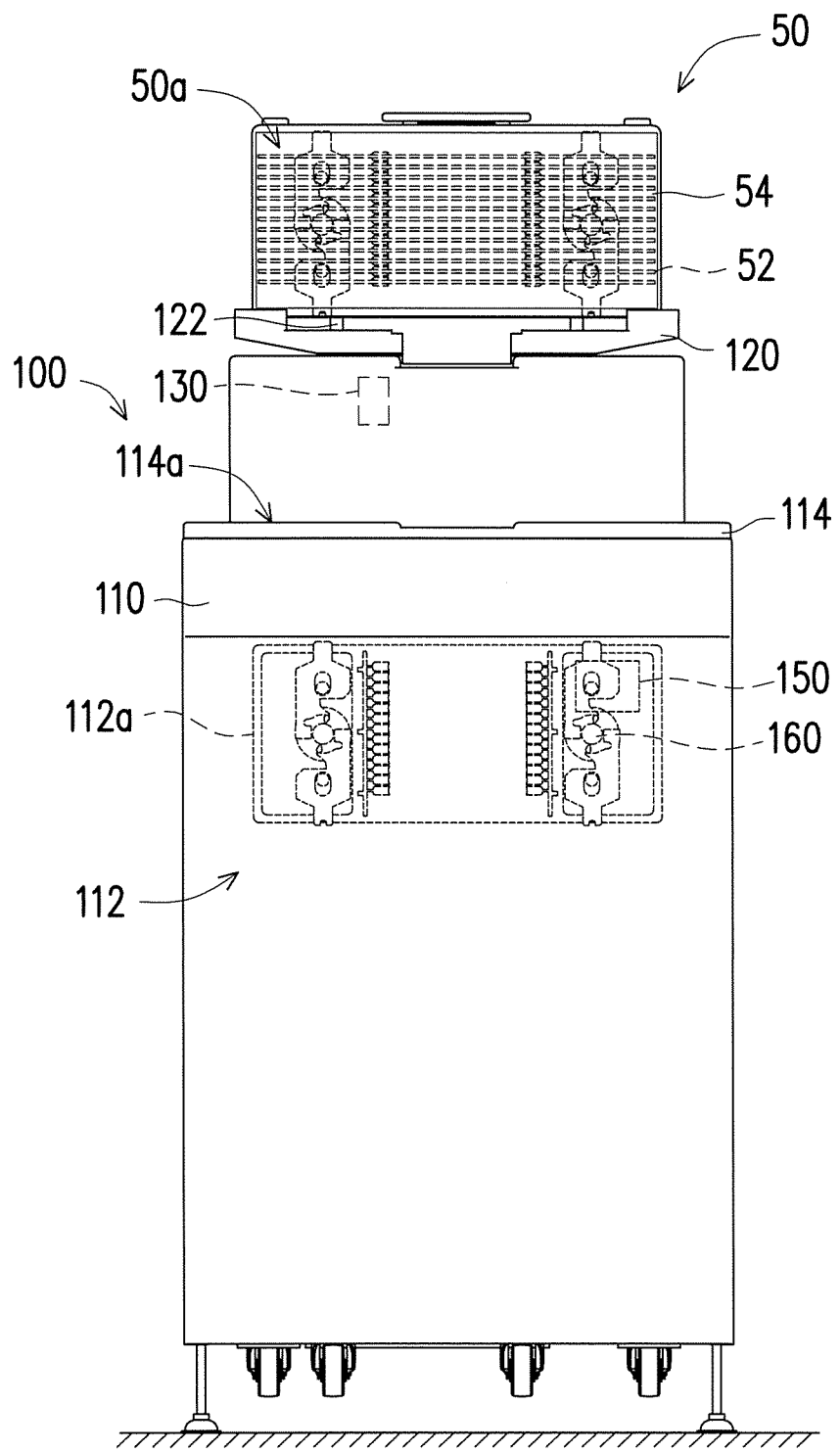
FIG. 1A is the front view illustrating a loading apparatus with a wafer cassette loaded thereon according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
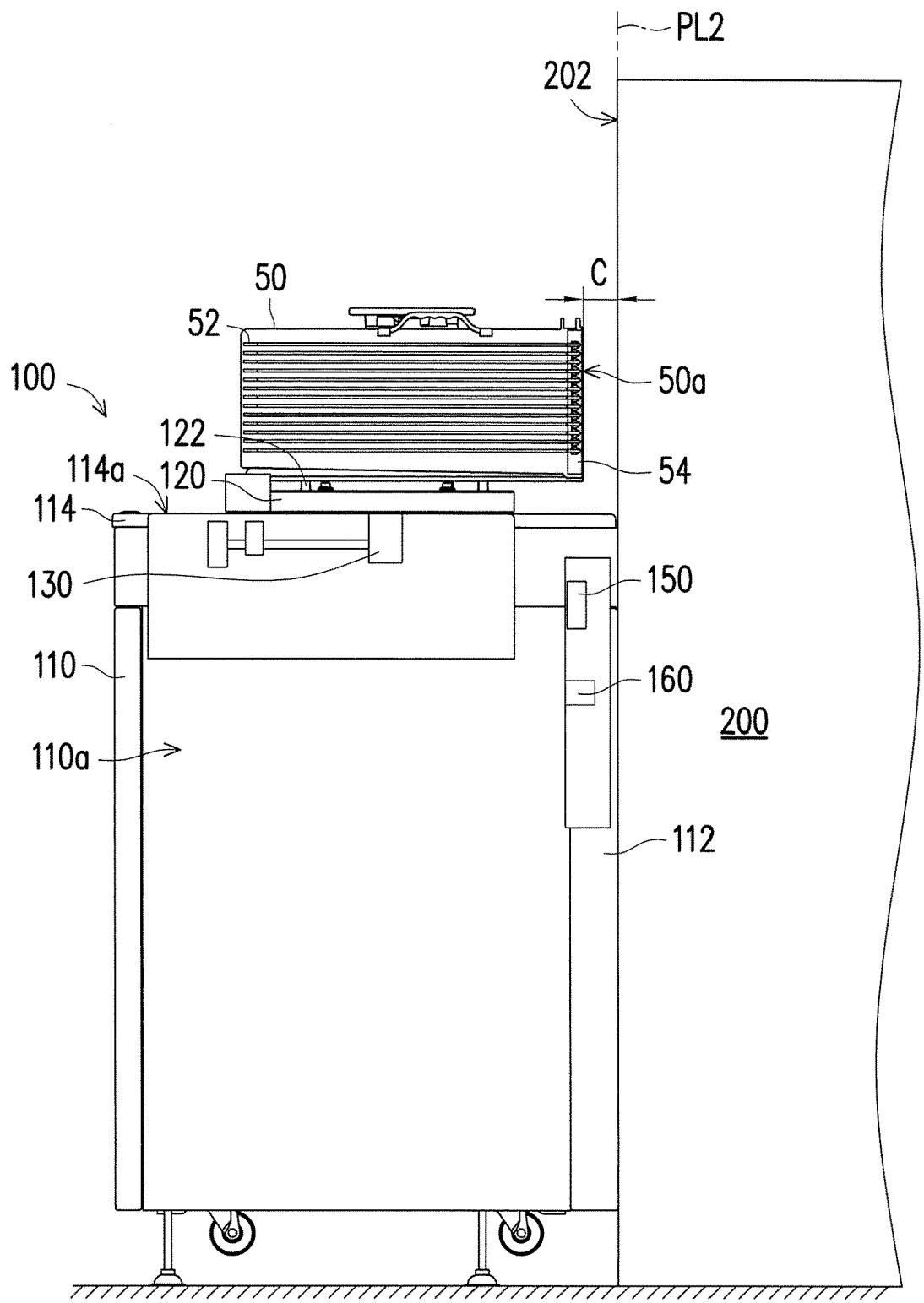
FIG. 1B is the schematic cross-sectional view illustrating a loading apparatus docked to a processing system according to some embodiments of the present disclosure.
Figure 2:
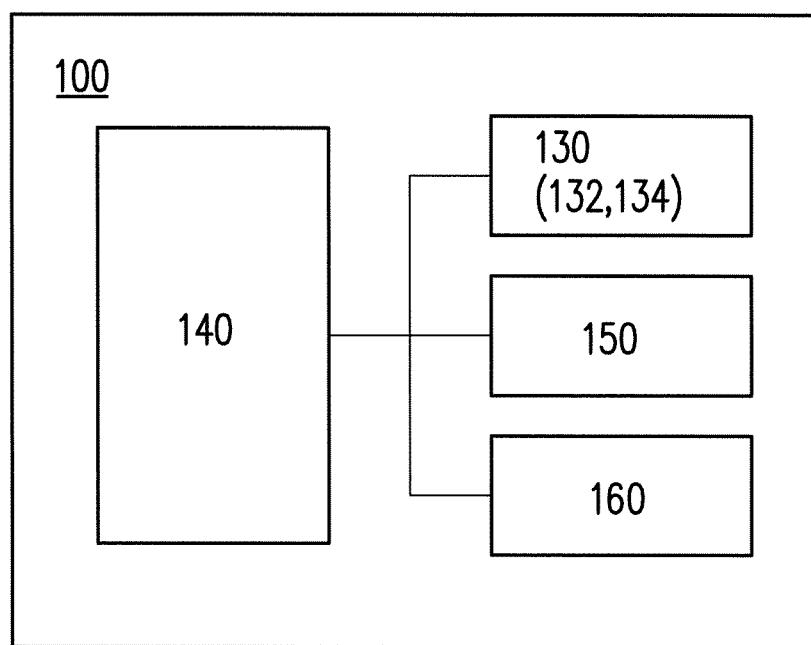
FIG. 2 is a block schematic diagram illustrating a control unit of a loading apparatus according to some embodiments of the present disclosure.

FIG. 1A is the front view illustrating a loading apparatus with a wafer cassette loaded thereon according to some embodiments of the present disclosure; FIG. 1B is the schematic cross-sectional view illustrating a loading apparatus docked to a processing system according to some embodiments of the present disclosure; FIG. 2 is a block schematic diagram illustrating a control unit of a loading apparatus according to some embodiments of the present disclosure. Referring to FIG. 1A, FIG. 1B and FIG. 2, a loading apparatus 100 for docking a processing system 200 and loading or unloading a wafer cassette 50 containing a plurality of wafers 52 is provided. The wafer cassette 50 may have a cassette door 54 located at a front side 50a of the wafer cassette 50 to secure the wafers 52 from contamination and damage during transit within the fabrication facility. The cassette door 54 can be opened and/or removed to permit the wafers 52 to be extracted from the wafer cassette 50 when the wafer cassette 50 is interfaced to the processing system 200. The wafer cassette 50 may be standardized with pins, ports, and latch mechanisms provided in a particular configuration, which is not limited thereto. For example, the loading apparatus 100 may be used to position the wafer cassette 50 at the desired position such that the wafers 52 enclosed by the wafer cassette 50 can be transported and unloaded into the processing system 200. During loading or transferring the wafer cassette 50, the cassette door 54 may be closed or locked by a locking mechanism (e.g. latch component or other suitable locking devices) of the wafer cassette 50. In some embodiments, the locking mechanism may be standardized as required by the Semiconductor Equipment and Materials International (SEMI). The locking mechanism can assure the cassette door 54 remains closed at times when the cassette door 54 is intended to be closed (e.g. during transport). The cassette door 54 may also be opened or unlock for unloading the wafers 52 into the processing system 200 or loading the wafers 52 back to the wafer cassette 50 after processes are completed. In some embodiments, the loading apparatus 100 is provided on one side of a docking interface 202 of the processing system 200. That is, the loading apparatus 100 is located on the exterior of the environment in which processing of wafers 52 is to be accomplished.

In some embodiments, the loading apparatus 100 includes a main body 110, a stage 120, a stage mover 130 and a controller 140. The main body 110 may include a space 110a and a front panel 112. When docking the loading apparatus 100 to the processing system 200, the front panel 112 is coupled to the docking interface 202 of the processing system 200. In some embodiments, the main body 110 may include a top panel 114 connected to the front panel 112. For example, the space 110a may be at least defined by the top panel 114 and the front panel 112. The top panel 114 may have an opening 114a which makes the space 110a communicate with the exterior environment. For example, the size of the opening 114a may be large enough to allow the stage 120 moving through it.

The stage 120 may be configured to carry the wafer cassette 50 and movably coupled to the main body 110 to move relative to the space 110a of the main body 110 through the opening 114a. For example, the stage 120 may include at least one pin 122 disposed on a top surface of the stage 120 for coupling the wafer cassette 50 to the stage 120. The pins 122 of the stage 120 may be mated to the alignment component on the bottom of the wafer cassette 50 such that after the wafer cassette 50 is guided onto the pins 112 of the stage 120, the wafer cassette 50 may be affixed on the stage 120. The stage mover 130 may be operationally coupled to the stage 120 to drive the stage 120. The controller 140 may be coupled to the stage mover 130 to control the stage 120 move vertically from a standby position to an intermediate position entering the space 110a of the main body 110, horizontally between the intermediate position and a door engaging position inside the space 110a of the main body 110, vertically from the intermediate position to a lifting position existing the space 110a of the main body 110, and horizontally between the lifting position and an unloading position outside the space 110a of the main body 110. The movement of the stage 120 will be described in greater detail with respect to FIG. 3A to FIG. 3F.

Figure 1B:
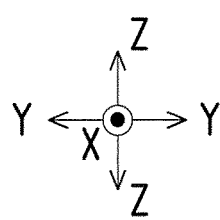

In some embodiments, when the stage 120 is controlled to be at the unloading position (as shown in FIG. 1), a predetermined clearance C is between the front side 50a of the wafer cassette 50 and the docking interface 202 of the processing system 200. For example, the predetermined clearance C may be approximately 30 mm. In some embodiments, the predetermined clearance C may be designed to meet applicable the SEMI standards.

The controller 140 may be disposed in any part of the main body 110 depending on the design requirements. In some embodiments, the controller 140 may be a computing device controlling the movement of the stage mover 130 by program instructions or codes, which is not limited thereto. In some embodiments, the stage mover 130 may include a z-axis mechanism 132 and a y-axis mechanism 134 respectively operating to move the stage 120 along the z-axis Z and the y-axis Y. For example, the z-axis mechanism 132 and the y-axis mechanism 134 may respectively include motor gears, guide rails for guiding the stage 120 and other driven components. The z-axis mechanism 132 and the y-axis mechanism 134 may be implemented as any suitable mechanism for elevating and translating the stage 120 carrying the wafer cassette 50. In some other embodiments, the stage mover 130 may further include an x-axis mechanism (not illustrated) operating to move the stage 120 along the x-axis, thereby providing the possibility of the various movement of the stage 120.

In some embodiments, the loading apparatus 100 may include a mapping sensor 150. For example, the mapping sensor 150 may be disposed in the main body 110 and coupled to the controller 140. In some embodiments, the mapping sensor 150 may map the wafers 52 to determine the numbers of wafers 52 when the wafer cassette 50 carried by the stage 120 moved from the intermediate position to the lifting position. For example, the mapping sensor 150 may be an optical sensor mounted on the front panel 112 to scan the wafers 52 in the wafer cassette 50, thereby eliminating the need to use the robot arms in time consuming mapping operations. The mapping sensor 150 may be other types of sensor, which is not limited thereto.

In some embodiments, the loading apparatus 100 may include a door engaging mechanism 160. For example, the front panel 112 may have a mounting area 112a located at the upper portion of the main body 110, and the mapping sensor 150 and the door engaging mechanism 160 may be configured in the mounting area 112a. In some embodiments, the motion of the wafer cassette 50 may cause the door engaging mechanism 160 to interact with the cassette door 54, such as the locking mechanism. The stage 120 may bring the locking mechanism on the cassette door 54 into engagement with the door engaging mechanism 160. For example, the door engaging mechanism 160 may engage and operate the locking mechanism of the cassette door 54 and then opens the cassette door 54 when the stage 120 carrying the wafer cassette 50 is positioned at the door engaging position. In other words, the door engaging mechanism 160 may be used to automatically unlock and/or open and/or remove the cassette door 54 for allowing access to the wafers 52. The stage 120 carrying the wafer cassette 50 may be moved though the opening 114a of the top panel 114 into the space 110a to the door engaging position for engaging the locking mechanism on the cassette door 54 with the door engaging mechanism 160. For example, when the locking mechanism of the cassette door 54 is physically in contact with the corresponding door engaging mechanism 160 of the loading apparatus 100, the controller 140 may control the door engaging mechanism 160 unlock and open the cassette door 54. The types of the door engaging mechanism 160 may depend on the design of the locking mechanism of the cassette door, which construes no limitation in the disclosure.

In some embodiments, after the cassette door 54 is unlocked and opened by the door engaging mechanism 160, the cassette door 54 may be left on the door engaging mechanism 160 to allow clear access to the wafers 52 inside the wafer cassette 50 for extracting out of the wafer cassette 50 to perform subsequent steps. In some other embodiments, after the cassette door 54 is unlocked by the door engaging mechanism 160, the cassette door 54 may stay on the wafer cassette 50 until the wafer cassette 50 carried by the stage 120 to be moved at the certain position. Then, the cassette door 54 is removed from the wafer cassette 50 by other mechanism configured in the processing system 200 or other than the loading apparatus 100 such that the wafers 52 is available for extraction from the wafer cassette 50 and loaded the wafers 52 into the processing system 200 for subsequent processes. After the processing of the wafers 52 is complete, the processed wafers 52 are stored back in the wafer cassette 50. In some embodiments, the stage 120 carrying the wafer cassette 50 may be moved into the space 110a to the door engaging position such that the cassette door 54 holding by the door engaging mechanism 160 can be mounted back onto the wafer cassette 50. Subsequently, the cassette door 54 may be closed and locked by the door engaging mechanism 160 for securement. In some other embodiments, after the processed wafers 52 are loaded back in the wafer cassette 50, the wafer cassette 50 may be closed using the cassette door 54 stored by the mechanism configured in the processing system 200. Subsequently, the stage 120 may bring the wafer cassette 50 into engagement with the door engaging mechanism 160 for locking the cassette door 54.

FIG. 3A to FIG. 3F are the schematic cross-sectional views illustrating an operating method of a loading apparatus according to some embodiments of the present disclosure. For example, the wafer cassette 50 may be loaded on the stage 120 of the loading apparatus 100. The stage 120 may be moved vertically among the standby position, the lifting position and the intermediate position, moved horizontally between the intermediate position and the door engaging position and moved horizontally between the lifting position and the unloading position. FIG. 3A to FIG. 3F taken in sequence depict the operation of the stage 120 once the wafer cassette 50 is received thereon.

Figure 3A:
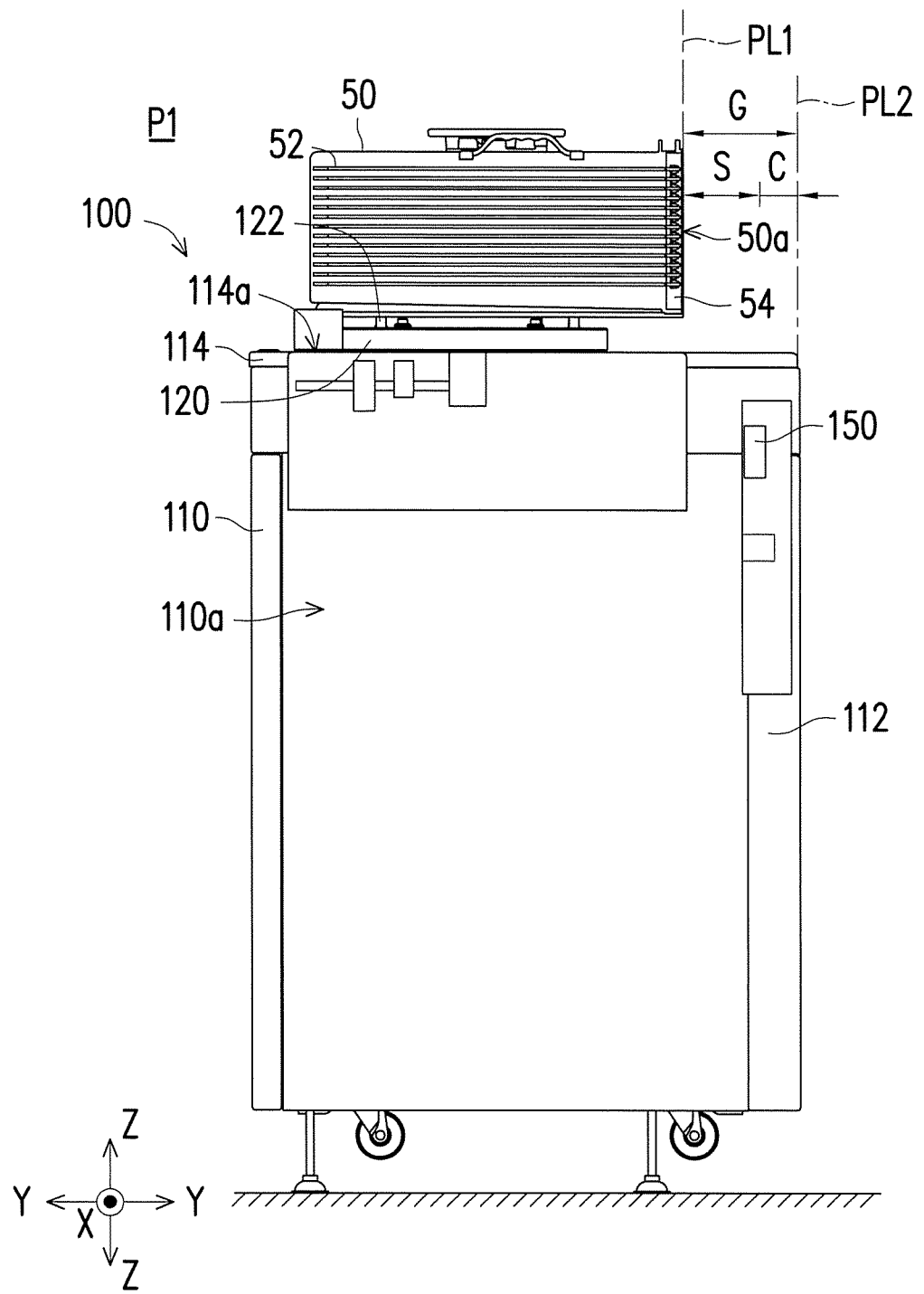
FIG. 3A to FIG. 3F are the schematic cross-sectional views illustrating an operating method of a loading apparatus according to some embodiments of the present disclosure.

First, referring to FIG. 3A, the wafer cassette 50 loaded on the top surface of the stage 120 outside the space 110a is referred to the standby position P1. For example, the wafer cassette 50 may be loaded onto the stage 120 of the loading apparatus 100 by the overhead hoist transport (OHT), or other suitable transporting equipment. For example, the wafer cassette 50 may be affixed on the stage 120 by the pins 122 to insure proper positioning on the movement of the wafer cassette 50. In some embodiments, at the standby position P1, a gap G is between a plane PL1 where the front side 50a of the wafer cassette 50 is located and a plane PL2 where the front panel 112 of the main body 110 is located. The plane PL2 may be considered as a reference plane where the x-axis and the z-axis lie in. For example, the gap G may be approximately 98 mm or in the range of 98±10% mm. In some embodiments, the gap G minus the predetermined clearance C may be considered as a safe clearance S between the wafer cassette 50 and the processing system 200. For example, the safe clearance S may be about 68±10% mm.

Figure 3B:
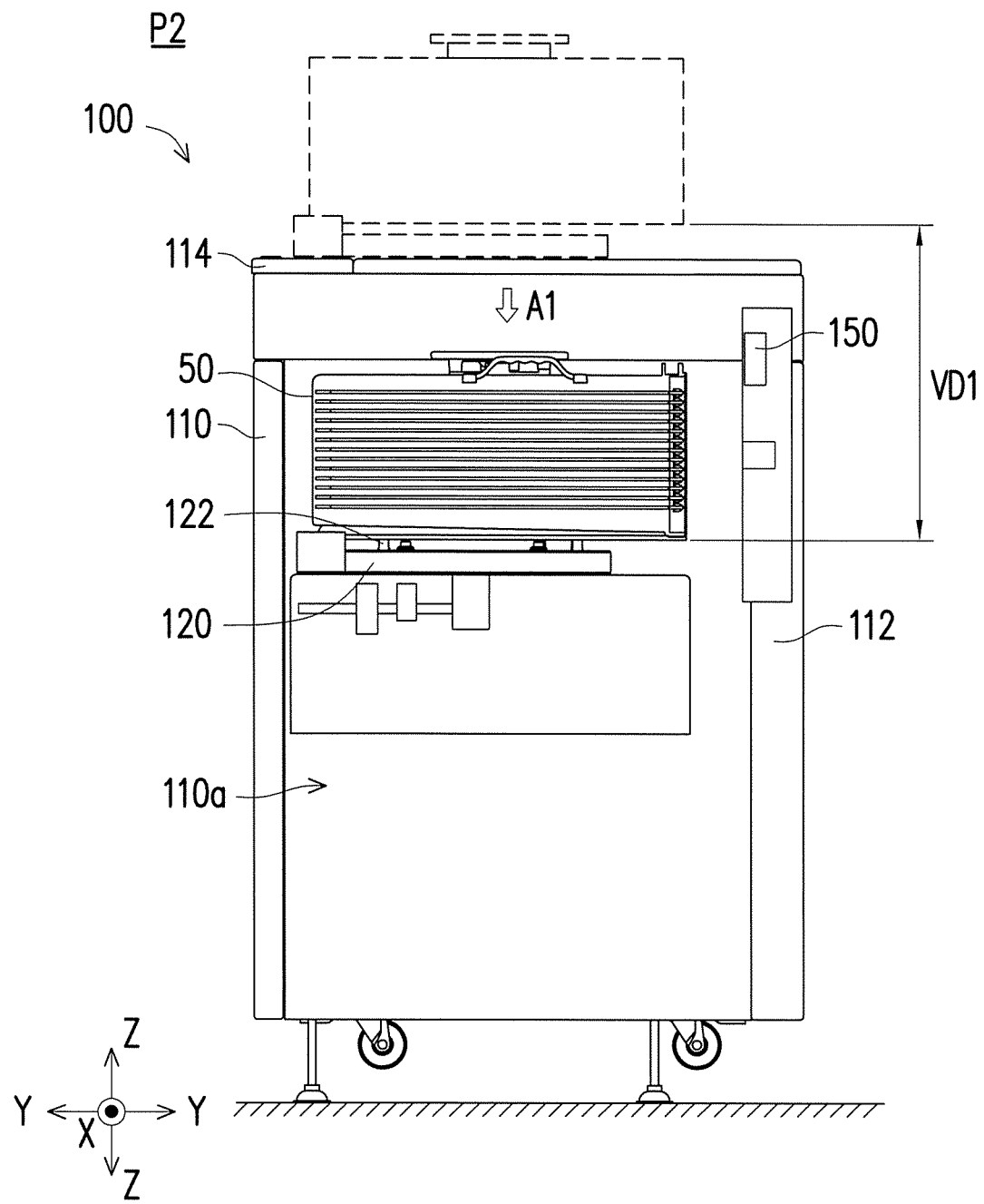

Next, referring to FIG. 3B, the stage 120 carrying the wafer cassette 50 may be controlled to move downwardly on the z-axis Z in a direction indicated by an arrow A1 from the standby position P1 to the intermediate position P2 by the z-axis mechanism 132 of the stage mover 130. For example, the stage 120 carrying the wafer cassette 50 is moved in a first vertical distance VD1. In some embodiments, the wafer cassette 50 carried by may be moved from outside the space 110a through the opening 114a of the top panel 114 and then moved into the space 110a of the main body 110.

Figure 3C:
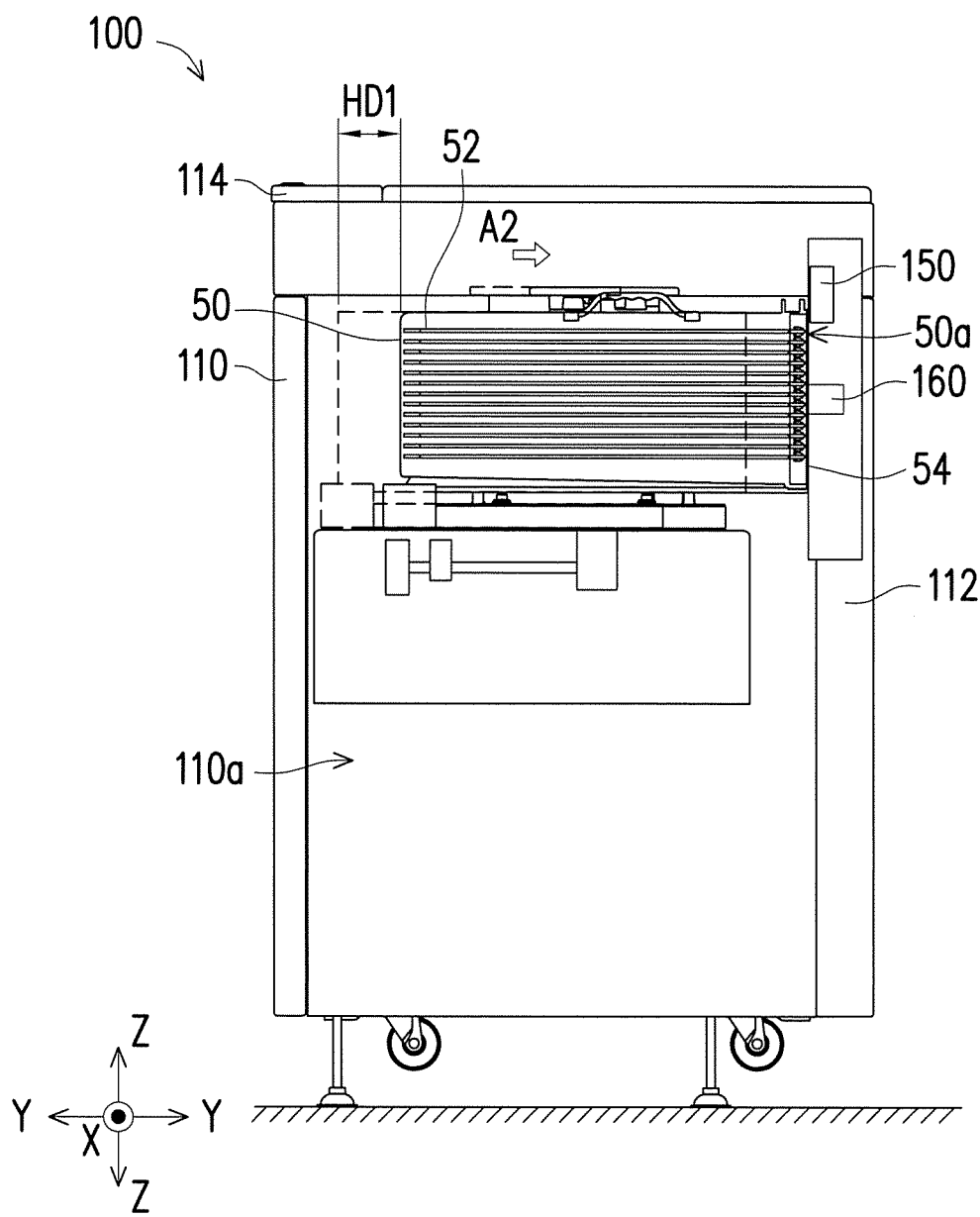

Referring to FIG. 3C, the stage 120 carrying the wafer cassette 50 may be moved forwardly on the y-axis Y in a direction indicated by an arrow A2 from the intermediate position P2 to the door engaging position P3 within the space 110a. For example, the wafer cassette 50 carried by the stage 120 is moved close to the front panel 112 of the main body 110 in a first horizontal distance HD1 by the y-axis mechanism 134 of the stage mover 130. The first horizontal distance HD1 may be approximately 37 mm or in the range of 37±10% mm. When the stage 120 is positioned at the door engaging position P3, the cassette door 54 is aligned with the door engaging mechanism 160 to allow horizontal access to the wafer cassette 50. Subsequently, the cassette door 54 may be unlocked and opened by the door engaging mechanism 160.

Figure 3D:
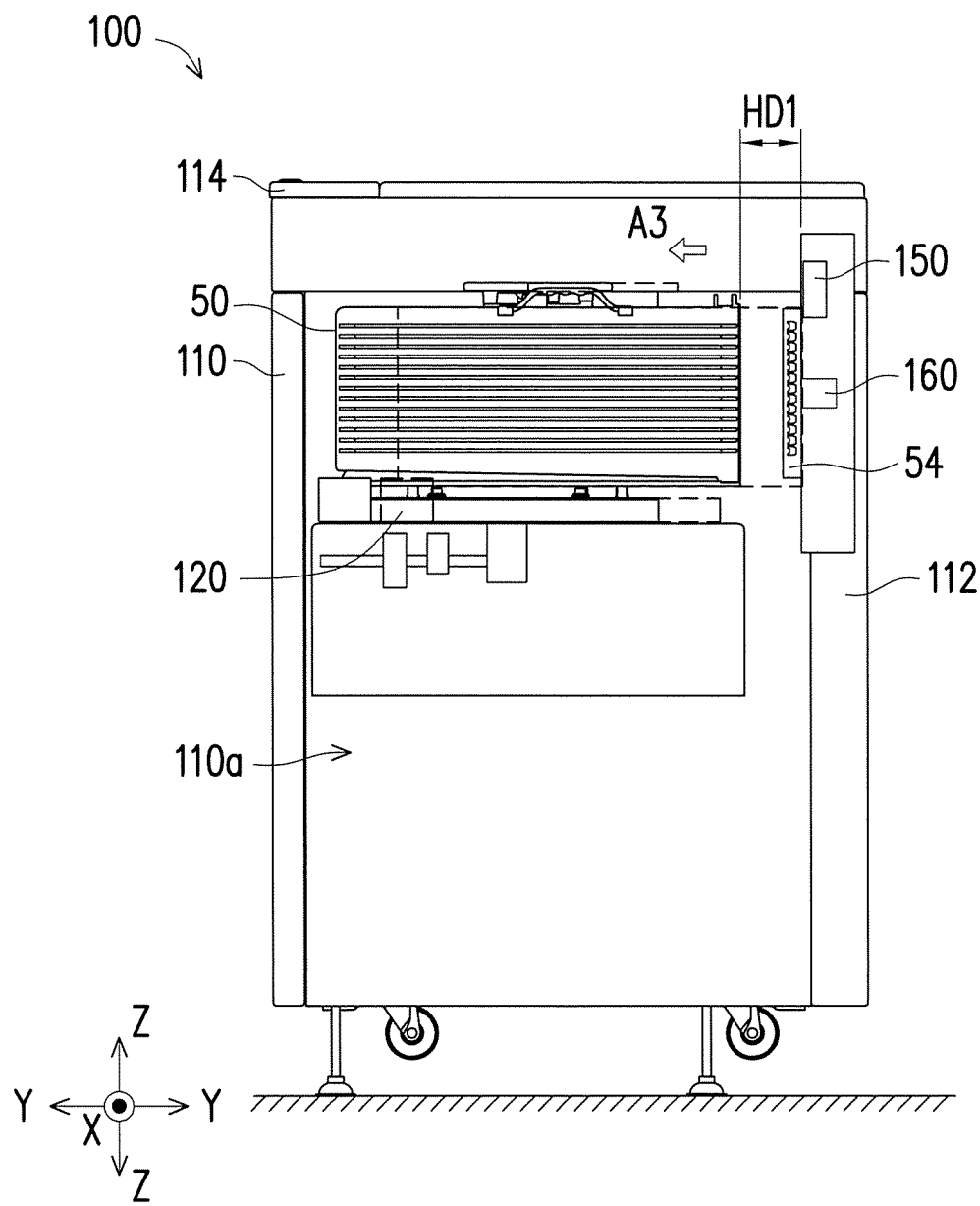

Referring to FIG. 3D, after the cassette door 54 is clear from the wafer cassette 50, the stage 120 carrying the wafer cassette 50 may be moved backwardly on the y-axis Y in a direction indicated by the arrow A3 opposite to the direction indicated by the arrow A2 from the door engaging position P3 back to the intermediate position P2. The wafer cassette 50 carried by the stage 120 is moved away from the front panel 112 of the main body 110 in the first horizontal distance HD1. In other words, the stage 120 carrying the wafer cassette 50 may be moved in a horizontal reciprocating manner between the intermediate position P2 and the door engaging position P3 by the y-axis mechanism 134 of the stage mover 130. In some other embodiments, the cassette door 54 may be removed from the wafer cassette 50. For example, when the wafer cassette 50 carried by the stage 120 is moved from the door engaging position P3 to the intermediate position P2, the cassette door 54 may be left on the door engaging mechanism 160, thereby exposing the wafers 52.

Figure 3E:
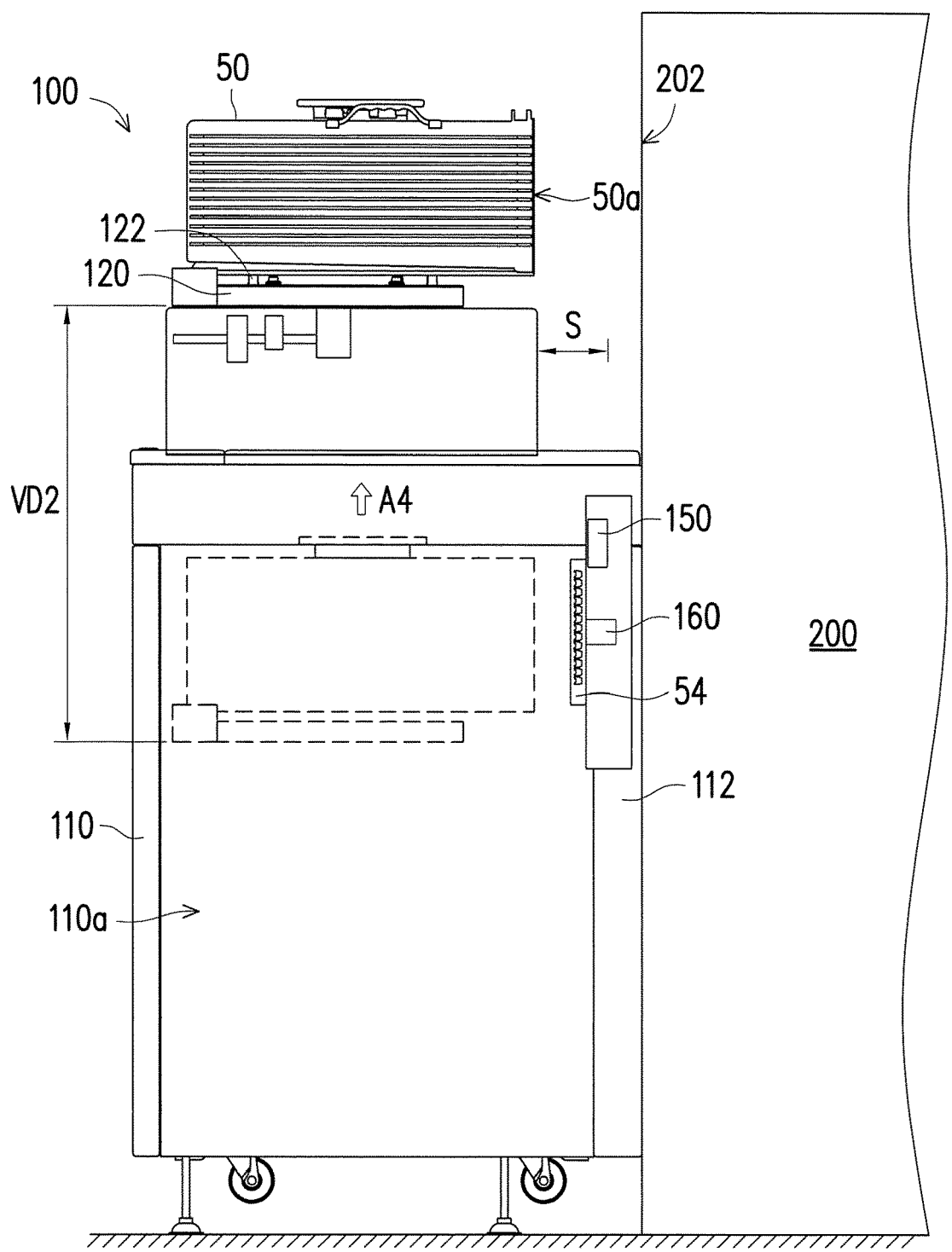

Referring to FIG. 3E, the stage 120 carrying the wafer cassette 50 may be moved upwardly on the z-axis Z in a direction indicated by an arrow A4 opposite to the direction indicated by the arrow A1 from the intermediate position P2 to the lifting position P4. For example, the stage 120 may be controlled to move from inside to outside the space 110a in a second vertical distance VD2. In some embodiments, the second vertical distance VD2 is greater than the first distance VD1. For example, the stage 120 is moved from the intermediate position P2 passing through the standby position P1 to the lifting position P4 and the elevation of the standby position P1 is lower than the elevation of the lifting position P4. In some embodiments, the location of the lifting position P4 may be changed in height as desired to meet the requirements of different types of the processing system 200. During moving the stage 120 from the intermediate position P2 to the lifting position P4 upwardly along the z-axis Z, the mapping sensor 150 may be controlled to map the wafers 52. By mapping the wafers 52 during moving from the intermediate position P2 to the lifting position P4, the wafer mapping information (e.g. the number of wafers 52, the slot position and the orientation of each wafer 52, etc.) may be obtained.

In some embodiments, after the stage 120 is positioned at the lifting position P4, the loading apparatus 100 may be docked to the processing system 200. For example, the front panel 112 of the main body 110 is coupled to the docking interface 202 of the processing system 200. After docking the loading apparatus 100 to the processing system 200, the stage 120 carrying the wafer cassette 50 may be moved along the y-axis Y close to or away from the docking interface 202 of the processing system 200 within the range of the safe clearance S without being interference.

Figure 3F:
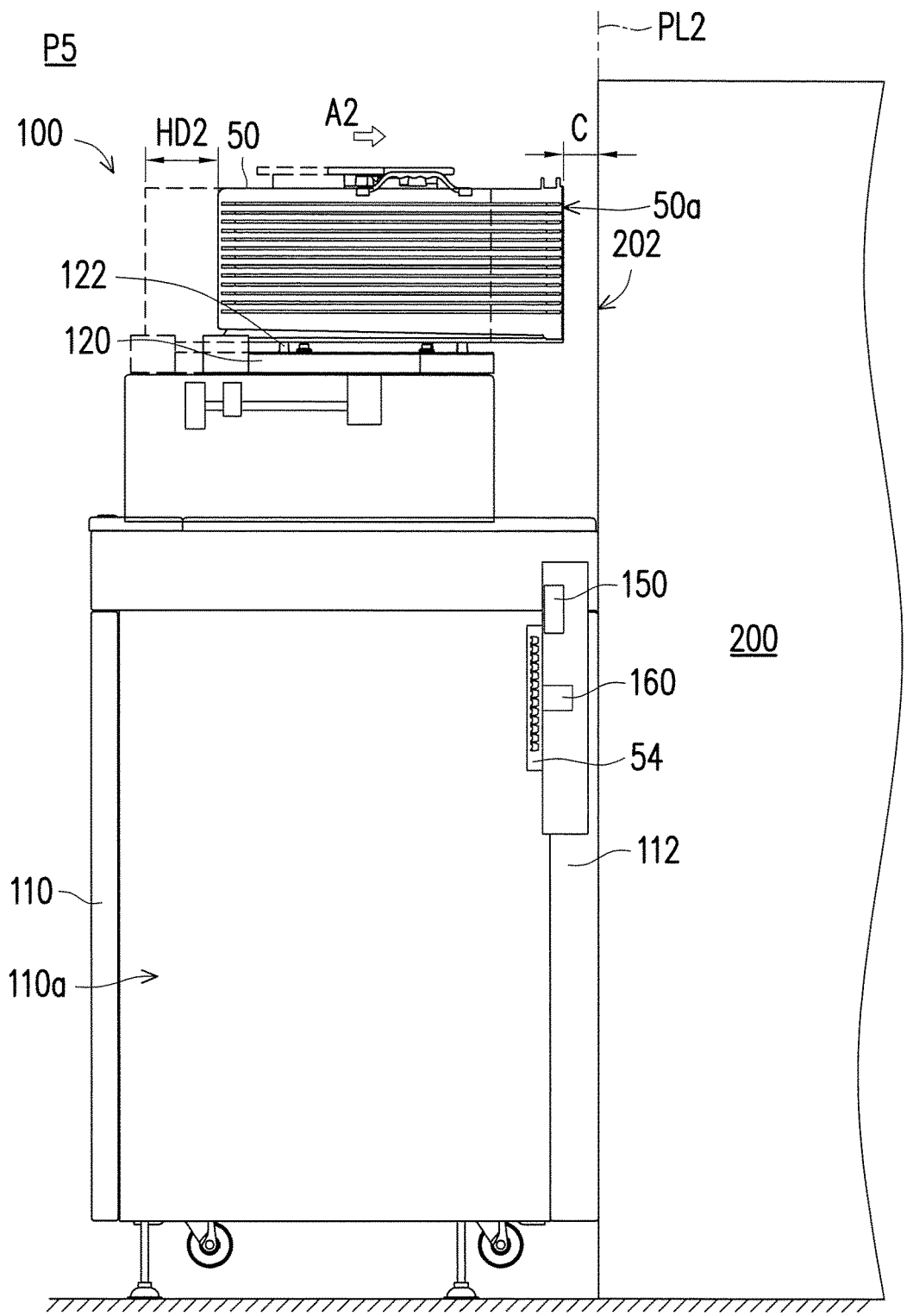

Referring to FIG. 3F, the stage 120 carrying the wafer cassette 50 may be moved forwardly on the y-axis Y in the direction indicated by the arrow A2 from the lifting position P4 to the unloading position P5. For example, the wafer cassette 50 carried by the stage 120 is moved close to the docking interface 202 of the processing system 200 in a second horizontal distance HD2. The second horizontal distance HD2 may range from, for example, approximately 68 mm to approximately 98 mm. In some embodiments, at the unloading position P5, the predetermined clearance C is between the front side 50a of the wafer cassette 50 and the plane PL2 where the front panel 112 is located or the docking interface 202 of the processing system 200. In some other embodiment, the stage 120 carrying the wafer cassette is moved forwardly in the second horizontal distance HD2 which is approximately 98 mm, the front side 50a of the wafer cassette 50 is aligned to the docking interface 202 of the processing system 200. In some embodiments, the stage 120 carrying the wafer cassette 50 may be moved in a horizontal reciprocating manner between the lifting position P4 and the unloading position P5. After the stage 120 is positioned at the unloading position P5, the wafers 52 may be extracted from the wafer cassette 50 and transported into the processing system 200 for subsequent processes.

Figure 4A:
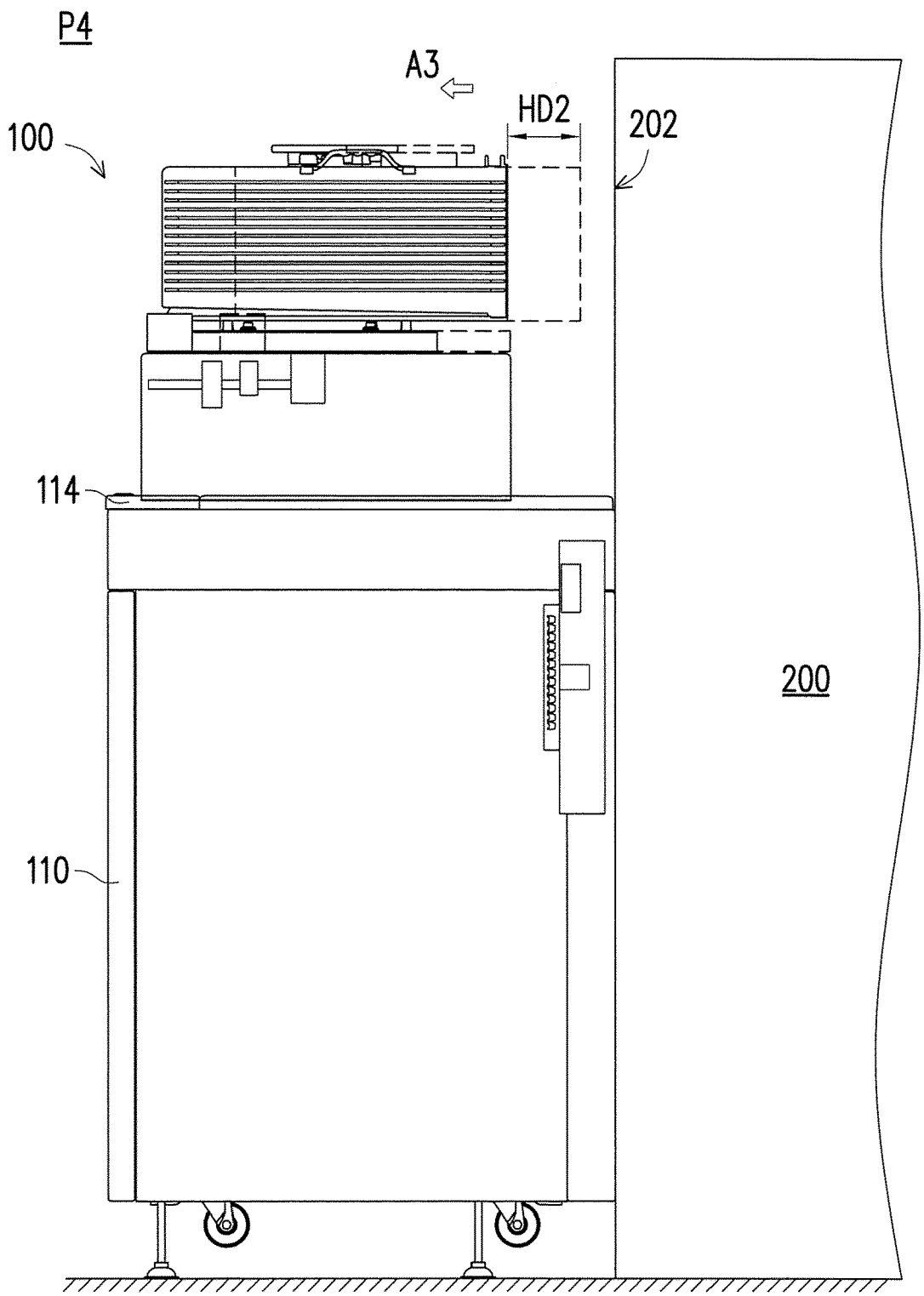
FIG. 4A to FIG. 4C are the schematic cross-sectional views illustrating an operating method of a loading apparatus according to some embodiments of the present disclosure.
Figure 4B:
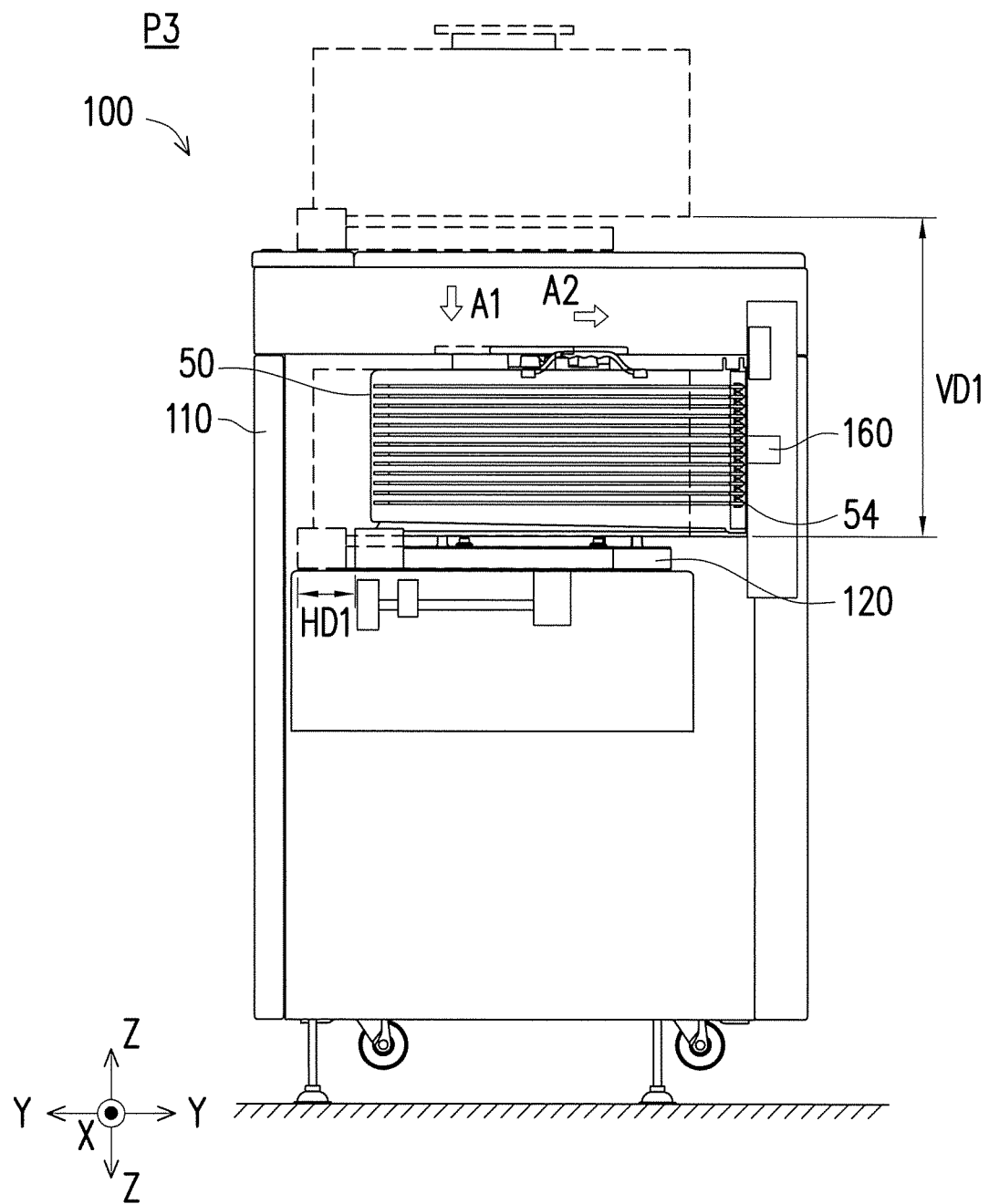
Figure 4C:
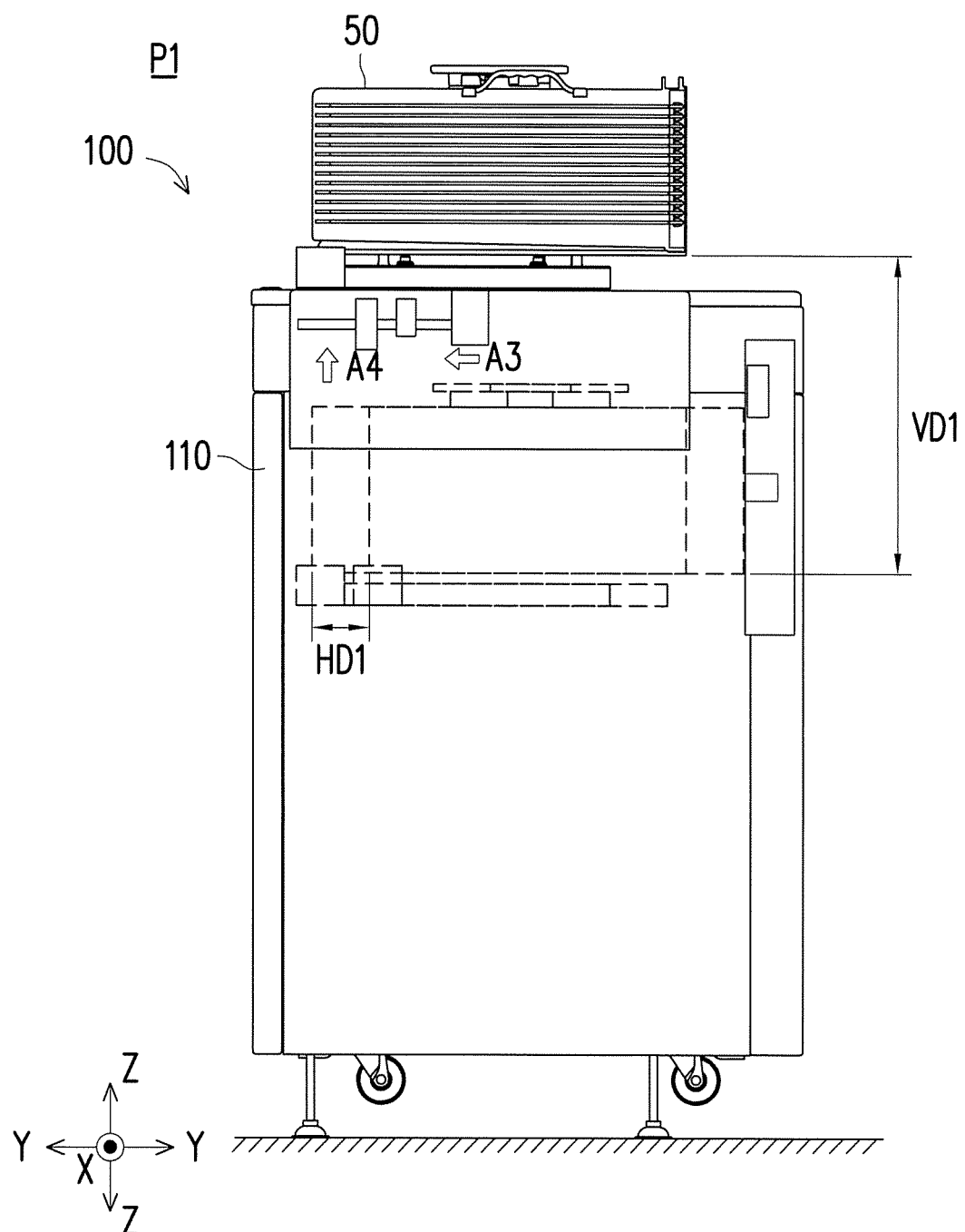

FIG. 4A to FIG. 4C are the schematic cross-sectional views illustrating an operating method of the loading apparatus 100 in which the wafers 52 are unloaded from the processing system 200 according to some embodiments of the present disclosure. For example, after the processes in the processing system 200 are complete, the wafers 52 may be loaded back into the wafer cassette 50. When the wafers 52 have been processed and returned to the wafer cassette 50, the wafer cassette 50 carried by the stage 120 is moved away from the processing system 200. It should be recognized that the unloading operating method of the loading apparatus 100 may be the reversing steps shown in FIG. 3A to 3F and the detailed descriptions are omitted for brevity.

Referring to FIG. 4A, the loading apparatus 100 is undocked from the processing system 200 after the wafer cassette 50 is moved away from the processing system 200. For example, the front panel 112 of the main body 110 is separated from the docking interface 202 of the processing system 200. The stage 120 carrying the wafer cassette 50 may be moved backwardly on the y-axis Y in the direction indicated by the arrow A3 from the unloading position P5 to the lifting position P4 in the second horizontal distance HD2.

Referring to FIG. 4B, the stage 120 is moved into the space 110a of the main body 110 to close the cassette door 54 of the wafer cassette 50. For example, after undocking the loading apparatus 100 from the processing system 200, the stage 120 carrying the wafer cassette 50 may be moved downwardly on the z-axis Z in the direction indicated by the arrow A1 from the lifting position P4 to the intermediate position P2 in the first vertical distance VD1. Subsequently, the stage 120 may be moved forwardly on the y-axis Y in the direction indicated by the arrow A2 to the door engaging position P3. When the stage 120 is positioned at the door engaging position P3, the cassette door 54 may be closed and/or locked by the door engaging mechanism 160 such that the processed wafers 52 are enclosed in the wafer cassette 50.

Referring to FIG. 4C, after closing the cassette door 54 of the wafer cassette 50, the stage 120 carrying the wafer cassette 50 may be moved backwardly on the y-axis Y in the direction indicated by the arrow A3 from the door engaging position P3 to the intermediate position P2 in the first horizontal distance HD1. Subsequently, the stage 120 carrying the wafer cassette 50 may be moved upwardly on the z-axis Z in the direction indicated by the arrow A4 to the standby position P1 in the first vertical distance VD1. For example, the wafer cassette 50 carried by the stage 120 is moved from inside to outside the space 110a of the main body 110. In some embodiments, at the standby position P1, the processed wafers 52 stored in the wafer cassette 50 is ready to be transported to the subsequent processing stations.

Figure 5A:
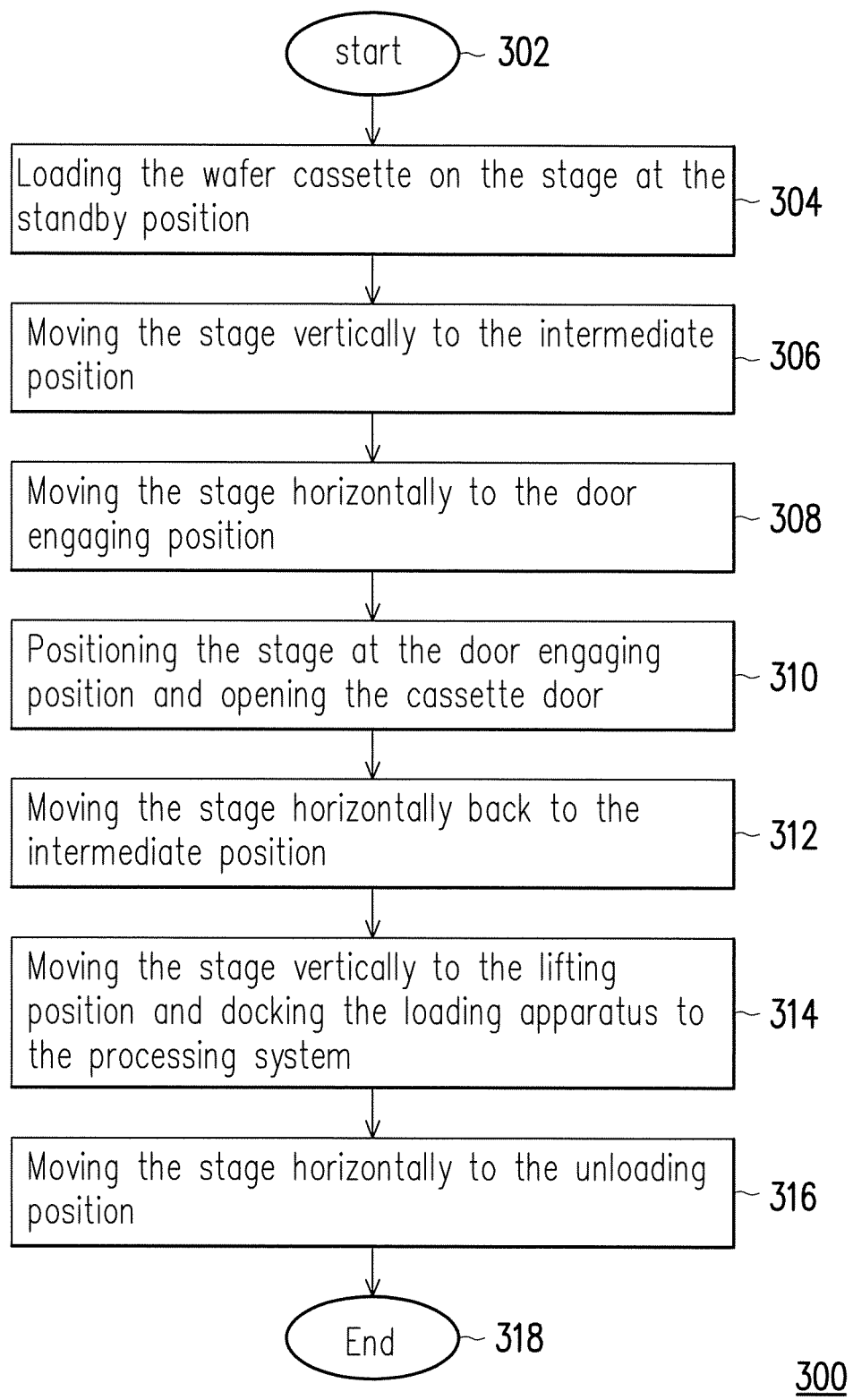
FIG. 5A and FIG. 5B are the flow diagrams illustrating an operating method of a loading apparatus according to some embodiments of the present disclosure.
Figure 5B:
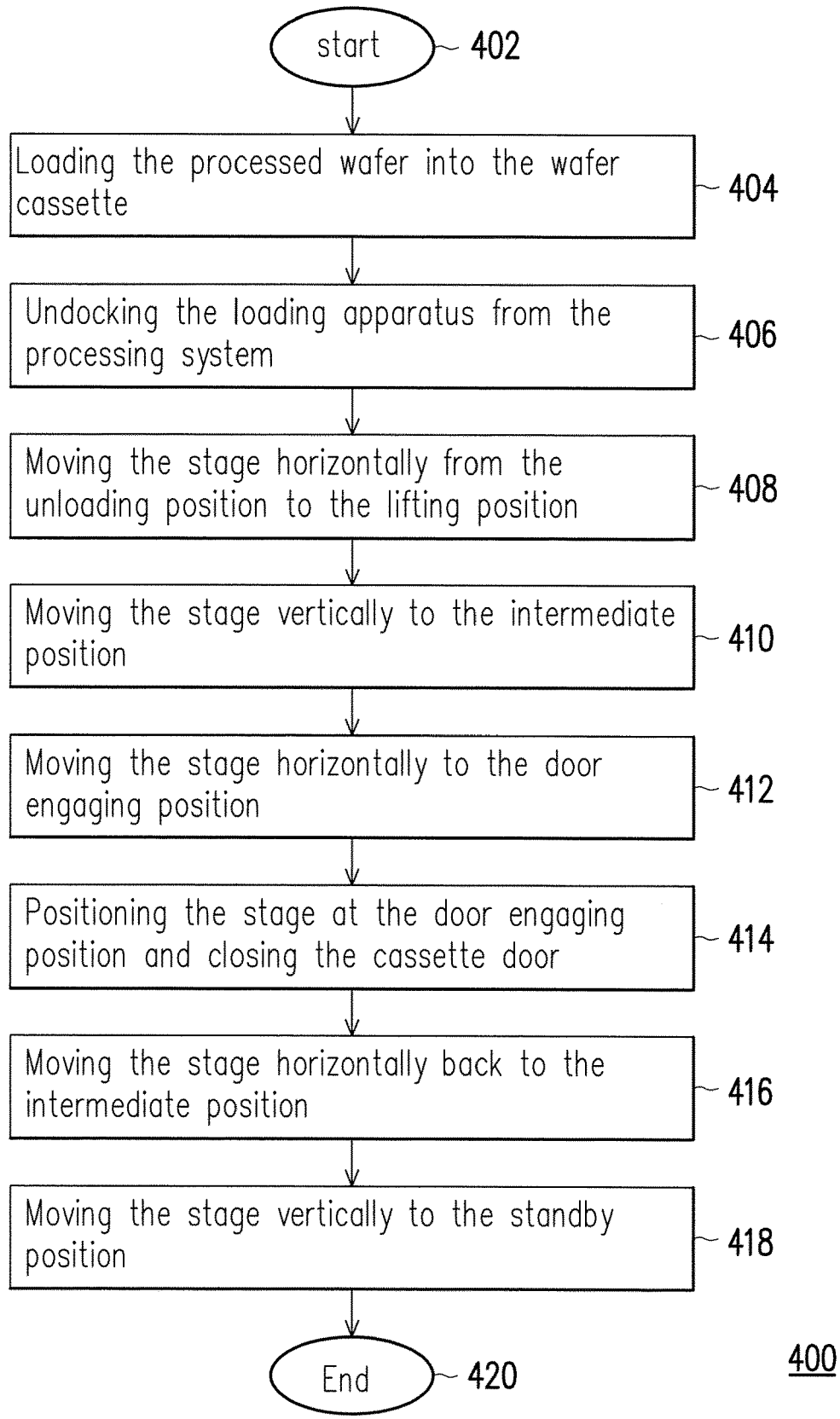

FIG. 5A and FIG. 5B are the flow diagrams illustrating an operating method of a loading apparatus according to some embodiments of the present disclosure. Referring to FIG. 5A, the operating method 300 of loading the wafers 52 to the processing system 200 begins at step 302, and in step 304, the wafer cassette 50 is loaded on the stage 120 at the standby position P1 outside the space 110a of the main body 110. In step 306, the stage 120 is controlled to move vertically to the intermediate position P2 into the space 110a of the main body 110. In step 308, the stage 120 is controlled to move horizontally to the door engaging position P3 within the space 110a of the main body 110. In step 310, the stage 120 is positioned at the door engaging position P3 and the cassette door 54 of the wafer cassette 50 is opened.

In step 312, the stage 120 is controlled to move horizontally back to the intermediate position P2 after opening the cassette door 54. In step 314, the stage 120 is controlled to move vertically to the lifting position P4 from inside the space 110a to outside the space 110a of the main body 110 and the loading apparatus 100 is docked to the processing system 200. In step 316, the stage 120 is controlled to move horizontally to the unloading position P5. After the wafers 52 are unloaded into the processing system 200, the operating method 300 of loading the wafers 52 to the processing system 200 is complete at step 318.

Referring to FIG. 5B, the operating method 400 of unloading the wafers 52 from the processing system 200 begins at step 402, and in step 404, the processed wafers 52 are loaded into the wafer cassette 50 after processing. In step 406, the loading apparatus 100 is undocked from the processing system 200. In step 408, the stage 120 is controlled to move horizontally from the unloading position P5 to the lifting position P4. In step 410, the stage 120 is controlled to move vertically to the intermediate position P2 and the wafer cassette 50 carried by the stage 120 is moved from outside the space 110a to inside the space 110a. In step 412, the stage 120 is controlled to move horizontally to the door engaging position P3. In step 414, the stage 120 is positioned at the door engaging position P3 and the cassette door 54 of the wafer cassette 50 is closed. In step 416, the stage 120 is controlled to move horizontally back to the intermediate position P2. In step 418, the stage 120 is controlled to move vertically to the standby position P1. After the stage 120 is positioned at the standby position P1, the operating method 400 of unloading the wafers 52 from the processing system 200 is complete at step 420.

Based on the above, the loading apparatus including the controller controlling the stage mover to move the stage in both y-axis and z-axis which allows the wafer cassette moved into the main body to open the cassette door. Since the cassette door is opened by the loading apparatus, the labor requirement may be reduced. In addition, at the standby position, the gap is between the side of the wafer cassette and the plane where the front panel is located. The gap may be considered as the safe clearance to avoid interfering during docking the loading apparatus to the processing system. Moreover, the predetermined clearance is between the side of the wafer cassette and the plane where the front panel is located. The predetermined clearance may be designed to meet applicable the SEMI standards. Furthermore, the advantages of including the mapping sensor in the loading apparatus include including the sensor in closer proximity to the wafers and eliminating the need to use the robot arms in time consuming mapping operations.

According to some embodiments, an operating method of a loading apparatus for processing a wafer cassette containing a plurality of wafers is provided. The operating method includes the following steps. The wafer cassette is loaded on a stage of the loading apparatus. The stage is configured to carry the wafer cassette and movably coupled to a main body of the loading apparatus to move within and out of a space of the main body. The stage is vertically moved among a standby position, a lifting position and an intermediate position, wherein the intermediate position is inside the space of the main body. The stage is horizontally moved from the intermediate position to a door engaging position inside the space of the main body. The stage is positioned at the door engaging position and opening a door of the wafer cassette. The stage is horizontally moved from the door engaging position to the intermediate position. The stage is horizontally moved between the lifting position and an unloading position outside the space of the main body after opening the cassette door of the wafer cassette.

According to some alternative embodiments, an operating method of a loading apparatus for processing a wafer cassette containing a plurality of wafers and docking to a processing system is provided. The operating method includes the following steps. The wafer cassette is loaded on a stage of the loading apparatus. The stage is configured to carry the wafer cassette and movably coupled to a main body of the loading apparatus to move within and out of a space of the main body. The stage is moved downwardly into the space of the main body. A door of the wafer cassette is opened inside the space of the main body. The stage is moved out of the space of the main body to an unloading position. At the unloading position, a predetermined clearance is between the wafer cassette and a docking interface of the processing system. The stage is positioned at the unloading position and the main body of the loading apparatus is docked to the processing system. A front panel of the main body is couple to the interface of the processing system.

According to some alternative embodiments, a loading apparatus for processing a wafer cassette containing a plurality of wafers is provided. The loading apparatus includes a main body, a stage, a stage mover and a controller. The main body includes a space. The stage is configured to carry the wafer cassette and movably coupled to the main body to move relative to the space of the main body. The stage mover is operationally coupled to the stage to drive the stage. The controller is coupled to the stage mover to control the stage move vertically from a standby position to an intermediate position entering the space of the main body, horizontally between the intermediate position and a door engaging position inside the space of the main body, vertically from the intermediate position to a lifting position existing the space of the main body, and horizontally between the lifting position and an unloading position outside the space of the main body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An operating method of a loading apparatus for processing a wafer cassette containing a plurality of wafers, the operating method comprising:
    loading the wafer cassette on a stage of the loading apparatus, wherein the stage is configured to carry the wafer cassette and movably coupled to a main body of the loading apparatus to move within and out of a space of the main body;
    vertically moving the stage among a standby position, a lifting position and an intermediate position, wherein the intermediate position is inside the space of the main body;
    horizontally moving the stage from the intermediate position to a door engaging position inside the space of the main body;
    positioning the stage at the door engaging position and opening a cassette door of the wafer cassette;
    horizontally moving the stage from the door engaging position to the intermediate position; and
    horizontally moving the stage between the lifting position and an unloading position outside the space of the main body after opening the cassette door of the wafer cassette.

2. The operating method according to claim 1, wherein vertically moving the stage among the standby position, the lifting position and the intermediate position comprises:
    moving the stage from the standby position to the intermediate position downwardly, wherein the wafer cassette carried by the stage moves from outside the space of the main body to inside the space of the main body; and
    moving the stage from the intermediate position to the lifting position upwardly, wherein the wafer cassette carried by the stage moves from inside the space of the main body to outside the space of the main body.

3. The operating method according to claim 2, wherein a first vertical distance from the standby position to the intermediate position is less than a second vertical distance from the intermediate position to the lifting position.

4. The operating method according to claim 2, further comprising:
    mapping the wafers during moving the stage from the intermediate position to the lifting position upwardly.

5. The operating method according to claim 1, wherein horizontally moving the stage from the intermediate position to the door engaging position inside the space of the main body is moving the stage forwardly relative to a front panel of the main body.

6. The operating method according to claim 5, wherein horizontally moving the stage from the door engaging position to the intermediate position is moving the stage backwardly relative to the front panel of the main body.

7. The operating method according to claim 1, wherein the wafer cassette is carried by the stage moving between the lifting position and the unloading position outside the space of the main body, and horizontally moving the stage between the lifting position and the unloading position comprises:
    moving the stage from the lifting position to the unloading position forwardly relative to a plane where a front panel of the main body is located; and
    moving the stage from the unloading position to the lifting position backwardly relative to the plane where the front panel is located.

8. The operating method according to claim 1, wherein a first horizontal distance of the stage between the intermediate position and the door engaging position is less than a second horizontal distance of the stage between the lifting position and the unloading position.

9. The operating method according to claim 1, wherein the main body comprising a front panel and the wafer cassette comprising a front side facing towards the same direction with the front panel, when the stage is at the unloading position, a predetermined clearance is between a plane where the front side of the wafer cassette is located and a plane where the front panel is located.

10. An operating method of a loading apparatus for processing a wafer cassette containing a plurality of wafers and docking to a processing system, the operating method comprising:

loading the wafer cassette on a stage of the loading apparatus, wherein the stage is configured to carry the wafer cassette and movably coupled to a main body of the loading apparatus to move within and out of a space of the main body;

moving the stage downwardly into the space of the main body;

opening a cassette door of the wafer cassette inside the space of the main body;

moving the stage out of the space of the main body to an unloading position, wherein at the unloading position, a predetermined clearance is between the wafer cassette and a docking interface of the processing system; and positioning the stage at the unloading position and docking the main body of the loading apparatus to the processing system, wherein a front panel of the main body is coupled to the docking interface of the processing system.

11. The operating method according to claim 10, further comprising:

mapping the wafers during moving the stage out of the space of the main body.

12. The operating method according to claim 10, further comprising:

undocking the main body from the processing system, wherein the front panel of the main body is separated from the docking interface of the processing system;

moving the stage into the space of the main body to close the cassette door of the wafer cassette; and moving the stage upwardly to a standby position, wherein the wafer cassette carried by the stage is moved from inside to outside the space of the main body.

13. A loading apparatus for processing a wafer cassette containing a plurality of wafers, the loading apparatus comprising:

a main body comprising a space;

a stage configured to carry the wafer cassette and movably coupled to the main body to move relative to the space of the main body;

a stage mover operationally coupled to the stage to drive the stage; and a controller coupled to the stage mover to control the stage to move vertically from a standby position to an intermediate position entering the space of the main body, horizontally between the intermediate position and a door engaging position inside the space of the main body, vertically from the intermediate position to a lifting position exiting the space of the main body, and horizontally between the lifting position and an unloading position outside the space of the main body.

14. The loading apparatus according to claim 13, wherein the stage mover comprises a y-axis mechanism and a z-axis mechanism respectively coupled to the controller and driven the stage move along on a y-axis and a z-axis.

15. The loading apparatus according to claim 14, wherein the stage is driven to move horizontally between the intermediate position and the door engaging position in a first horizontal distance and between the lifting position in a second horizontal distance and the unloading position respectively through the y-axis mechanism of the stage mover.

16. The loading apparatus according to claim 15, wherein the first horizontal distance is less than the second horizontal distance.

17. The loading apparatus according to claim 14, wherein the stage is driven to move vertically from the standby position to the intermediate position in a first vertical distance and move vertically from the intermediate position to the lifting position in a second vertical distance respectively through the z-axis mechanism of the stage mover.

18. The loading apparatus according to claim 17, wherein the first vertical distance is less than the second vertical distance.

19. The loading apparatus according to claim 13, further comprising:

a mapping sensor disposed in the main body and mapping the wafers.

20. The loading apparatus according to claim 13, wherein the loading apparatus is adapted to dock to a processing system, the main body comprising a front panel coupled to the processing system and the wafer cassette comprising a front side facing towards the same direction with the front panel, when the loading apparatus is docked to the processing system, a predetermined clearance is between a plane where the front side of the wafer cassette is located and a plane where the front panel of the main body is located.

* * * * *